(12) United States Patent
Harada et al.

(10) Patent No.: US 10,429,964 B2
(45) Date of Patent: Oct. 1, 2019

(54) TOUCH PANEL, METHOD OF MANUFACTURING TOUCH PANEL, AND OPTICAL THIN FILM

(71) Applicant: ULVAC, INC., Chigasaki-shi (JP)

(72) Inventors: Manabu Harada, Chigasaki (JP); Hidenori Yanagitsubo, Chigasaki (JP); Atsuhito Ihori, Chigasaki (JP); Toshihiro Suzuki, Chigasaki (JP); Masahiro Matsumoto, Chigasaki (JP); Noriaki Tani, Chigasaki (JP); Masashi Kubo, Chigasaki (JP)

(73) Assignee: ULVAC, INC., Chigasaki-Shi (JP)

( * ) Notice: Subject to any disclaimer, the term of this patent is extended or adjusted under 35 U.S.C. 154(b) by 242 days.

(21) Appl. No.: 15/307,545

(22) PCT Filed: Apr. 28, 2015

(86) PCT No.: PCT/JP2015/062859
§ 371 (c)(1),
(2) Date: Oct. 28, 2016

(87) PCT Pub. No.: WO2015/166954
PCT Pub. Date: Nov. 5, 2015

(65) Prior Publication Data
US 2017/0060284 A1    Mar. 2, 2017

(30) Foreign Application Priority Data

May 1, 2014    (JP) .................................. 2014-094890

(51) Int. Cl.
*G06F 3/041*    (2006.01)
*C23C 14/35*    (2006.01)
(Continued)

(52) U.S. Cl.
CPC ............ *G06F 3/041* (2013.01); *C23C 14/352* (2013.01); *C23C 14/083* (2013.01); *C23C 14/10* (2013.01);
(Continued)

(58) Field of Classification Search
None
See application file for complete search history.

(56) References Cited

U.S. PATENT DOCUMENTS 5,648,653 A * 7/1997 Sakamoto ......... H01L 27/14618
250/208.1
9,740,315 B2 * 8/2017 Tseng ...................... G06F 3/047
(Continued)

FOREIGN PATENT DOCUMENTS

CN    1646972    7/2005
CN    201369038    12/2009
(Continued)

OTHER PUBLICATIONS

Office Action from related U.S. Appl. No. 14/467,034, dated Oct. 24, 2016.
(Continued)

*Primary Examiner* — Dorothy Harris
(74) *Attorney, Agent, or Firm* — Grossman, Tucker, Perreault & Pfleger, PLLC

(57) ABSTRACT

A touch panel of the present invention includes a touch panel substrate, a cover substrate provided to overlap the touch panel, and a connection part including a scattering layer laminated from the cover substrate side toward the touch panel substrate side and is provided between the touch panel substrate and the cover substrate in an area other than a display area.

4 Claims, 6 Drawing Sheets

(51) Int. Cl.
*C23C 14/08* (2006.01)
*C23C 14/10* (2006.01)

(52) U.S. Cl.
CPC .............. *G06F 2203/04103* (2013.01); *G06F 2203/04107* (2013.01)

(56) References Cited

U.S. PATENT DOCUMENTS

| | | | |
|---|---|---|---|
| 2005/0157229 A1 | 7/2005 | Hamawaki | |
| 2005/0170158 A1* | 8/2005 | Hattori | B32B 7/00 428/212 |
| 2005/0237472 A1* | 10/2005 | Shibahara | C09K 19/02 349/167 |
| 2006/0209386 A1 | 9/2006 | Sudak et al. | |
| 2008/0165139 A1 | 7/2008 | Hotelling et al. | |
| 2012/0026107 A1* | 2/2012 | Kim | G06F 3/044 345/173 |
| 2012/0154725 A1 | 6/2012 | Jeon et al. | |
| 2012/0181063 A1* | 7/2012 | Nakajima | G06F 3/044 174/133 R |
| 2012/0256851 A1* | 10/2012 | Wang | G06F 3/041 345/173 |
| 2012/0292170 A1* | 11/2012 | Yin | G06F 3/044 200/512 |
| 2013/0100039 A1 | 4/2013 | Hong et al. | |
| 2013/0106746 A1* | 5/2013 | Lai | G06F 3/041 345/173 |
| 2013/0162570 A1 | 6/2013 | Shin et al. | |
| 2013/0234996 A1* | 9/2013 | Hecht | G06F 3/0436 345/177 |
| 2014/0028928 A1* | 1/2014 | Yu | G02F 1/13338 349/12 |
| 2014/0063361 A1* | 3/2014 | Lo | G06F 1/16 349/12 |
| 2014/0204286 A1* | 7/2014 | Park | G06F 1/1626 349/12 |
| 2014/0320956 A1 | 10/2014 | Taka et al. | |
| 2015/0034370 A1* | 2/2015 | Yu | G06F 3/041 174/255 |
| 2016/0109971 A1 | 4/2016 | Harada et al. | |

FOREIGN PATENT DOCUMENTS

| | | |
|---|---|---|
| CN | 102810020 | 6/2011 |
| CN | 103049119 | 4/2013 |
| CN | 103092379 | 5/2013 |
| CN | 103176302 | 6/2013 |
| CN | 203025672 | 6/2013 |
| CN | 203381287 | 1/2014 |
| JP | 2000-105537 | 4/2000 |
| JP | 2001-07-27 | 7/2001 |
| JP | 2008-145664 | 6/2008 |
| JP | 2009-051133 | 3/2009 |
| JP | 2011-129110 | 6/2011 |
| JP | 2012-226688 | 11/2012 |
| JP | 2013-131099 | 4/2013 |
| JP | 2013-152639 | 8/2013 |
| JP | 2013-245151 | 12/2013 |
| KR | 10-2010-0040114 | 4/2010 |
| KR | 10-2012-0067031 | 6/2012 |
| KR | 10-2012-0134955 | 12/2012 |
| TW | 201248460 | 12/2012 |
| WO | 2013/089066 | 6/2013 |
| WO | 2015/005437 | 1/2015 |

OTHER PUBLICATIONS

Office Action from related Chinese Appln. No. 201480003204.9 dated Nov. 16, 2016. English translation attached.
Office Action from related Taiwanese Appln. No. 104113765, dated Apr. 17, 2018. English translation attached.
Office Action from related Korean Appln. No. 10-2015-7014085, dated Mar. 4, 2016. English translation attached.
International Search Report from corresponding PCT Application No. PCT/JP2014/068458 dated Aug. 19, 2014. English translation attached.
International Search Report from corresponding PCT Application No. PCT/JP2015/062859 dated Jun. 30, 2015. English translation attached.
Final Office Action from related U.S. Appl. No. 14/467,034, dated Apr. 18, 2017.
Office Action from related Chinese Appln. No. 201580022405.8, dated Jul. 24, 2018. English translation attached.

* cited by examiner

Prior Art

TOUCH PANEL, METHOD OF MANUFACTURING TOUCH PANEL, AND OPTICAL THIN FILM

CROSS-REFERENCE TO RELATED APPLICATION

This is the U.S. National Phase Application under 35 U.S.C. § 371 of International Patent Application No. PCT/JP2015/062859 filed Apr. 28, 2015, which designated the United States and was published in a language other than English, which claims the benefit of Japanese Patent Application No. 2014-094890 filed on May 1, 2014, both of which are incorporated by reference herein.

TECHNICAL FIELD

The present invention relates to a technology that is preferably used for a touch panel, a method for manufacturing a touch panel, and an optical thin film.

BACKGROUND ART

In recent years, liquid crystal display devices with touch panels that have a combined function of an input device have been widely used as display devices of electronic apparatuses including mobile telephones and portable game devices.

Such a touch panel has a touch panel substrate in which a conductive layer having a light transmission property or the like is laminated on a transparent substrate and a film is laminated on the outermost surface to detect an operation location of a finger or the like according to a change in capacitance, or the like.

As touch panels, various types of touch panels such as a resistive film type and a capacitive type according to differences in their structures and detection methods are known.

For example, a touch panel substrate provided with a film-like upper substrate and lower substrate having a light transmission property is known. A plurality of substantially strip-shaped upper conductive layers having a light transmission property such as indium tin oxide or the like are formed on an upper surface of the upper substrate to be arrayed in the front-rear direction. In addition, a plurality of upper electrodes formed by overlapping conductive metal foil of copper, silver, or the like on indium tin oxide or the like using vapor deposition or the like are formed in the left-right direction that is an orthogonal direction to the upper conductive layers. A plurality of substantially strip-shaped lower conductive layers having a light transmission property such as indium tin oxide or the like are formed on an upper surface of the lower substrate to be arrayed in the left-right direction that is orthogonal to the upper conductive layers. In addition, a plurality of lower electrodes that are similar to the upper electrodes of which the terminals of one side are connected to the terminals of the lower conductive layers are formed in the left-right direction that is parallel with the lower conductive layers.

Furthermore, a film-like cover substrate having a light transmission property is overlaid on the upper surface of the upper substrate and bonded to the touch panel substrate by an adhesive.

FIG. 7 is a cross-sectional diagram of a touch panel of the related art. In FIG. 7, reference symbol P represents a touch panel substrate, and reference symbol C represents a cover substrate. A light shielding film th having a non-light-transmission property is provided on an edge part E of the surface of the cover substrate C facing the touch panel substrate P positioned on the outer circumference or an outer side of a touch area (display area) T in which operations are performed.

This light shielding film th is known to be formed to a thickness of about 5 μm to 20 μm on the cover substrate C using printing or the like as disclosed in Patent Literature 1.

However, when the light shielding film th having the non-light-transmission property at the edge part E is formed on the surface of the cover substrate C facing the touch panel substrate P approximately in the thickness dimension using printing, a space is made between the cover substrate C and the touch panel P as indicated by Air in FIG. 7, and reflection occurs on the rear surface of the cover substrate C or on the surface of the touch panel substrate P, which results in problems that visibility deteriorates and output of a display means is impeded due to the deterioration in visibility.

Furthermore, if a conductor such as a metal is provided on the edge part E as disclosed in Patent Literature 1, the conductor has a different dielectric constant from the cover substrate C or the panel part P, and thus there is a possibility of a property such as a radio property deteriorating, which is not favorable.

In addition, Patent Literature 2 discloses a touch panel.

PRIOR ART DOCUMENTS

Patent Documents

[Patent Literature 1]
Japanese Unexamined Patent Application, First Publication No. 2012-226688
[Patent Literature 2]
International Patent Publication No. WO2015/005437

DISCLOSURE OF INVENTION

Problems to be Solved by the Invention

In addition to three objectives (1. to prevent deterioration in visibility, 2. to achieve thinning of an edge part, and 3. to obtain an edge part having a dielectric constant of the same degree as that of a substrate formed of glass, and so on while maintaining light shielding performance), the present invention aims to achieve a fourth objective of obtaining a white edge part (connection part) as well.

Means for Solving the Problems

The present inventors have found a method for accomplishing the three objectives described above, taking the above circumstances into account (Patent Literature 2). According to Patent Literature 2, it is possible to provide a touch panel that can realize prevention of deterioration in visibility, thinning of an edge part (connection part), and the edge part having a dielectric constant of the same degree as that of a substrate formed of glass or the like, while light shielding performance is maintained. In addition, with regard to the color of the edge part (connection part) of the touch panel, it is ascertained that black, red, yellow, blue, green, and the like can be realized by devising a laminate structure of a color layer. However, in the laminate structure of the color layer disclosed in Patent Literature 2, it was not possible to obtain a white edge part (connection part) for which demand is high in the touch panel market.

In order to accomplish the four objectives described above, the inventors have found the following means.

A touch panel according to a first aspect of the present invention has a touch panel substrate, a cover substrate provided to overlap the touch panel, and a connection part including a scattering layer laminated from the cover substrate side toward the touch panel substrate side and being provided between the touch panel substrate and the cover substrate in an area other than a display area.

According to the first aspect, the scattering layer may be formed from a multilayered structure in which a first dielectric layer and a second dielectric layer are alternately laminated.

According to the first aspect, a film thickness of each of the first dielectric layer and the second dielectric layer may be equal to or less than 10 nm.

According to the first aspect, in the multilayered structure of the scattering layer, the number of dielectric laminates formed of the first dielectric layer and the second dielectric layer may be equal to or more than 50.

According to the first aspect, the connection part may include the scattering layer and a reflection layer formed to cover the scattering layer.

A method for manufacturing a touch panel according to a second aspect of the present invention is a method for manufacturing a touch panel having a touch panel substrate, a cover substrate provided to overlap the touch panel substrate, and a connection part that includes a scattering layer provided between the touch panel substrate and the cover substrate in an area other than a display area, the method including a process of forming the scattering layer formed from a multilayered structure in which a first dielectric layer and a second dielectric layer are alternately laminated in a vacuum, and, in the process of forming the scattering layer, the first dielectric layer and the second dielectric layer are each laminated to have a film thickness of equal to or less than 10 nm.

An optical thin film according to a third aspect of the present invention includes a scattering layer formed from a multilayered structure in which a first dielectric layer and a second dielectric layer are alternately laminated.

According to the third aspect, a film thickness of each of the first dielectric layer and the second dielectric layer may be equal to or less than 10 nm.

According to the third aspect, in the multilayered structure of the scattering layer, the number of dielectric laminates formed of the first dielectric layer and the second dielectric layer may be equal to or more than 50.

The optical thin film according to the third aspect may further include a reflection layer provided to cover the scattering layer.

The optical thin film according to the third aspect may be formed on a transparent substrate.

According to the third aspect, the transparent substrate may be formed of glass or a resin.

Effects of the Invention

According to the touch panel with regard to the above-described aspects of the present invention, it is possible to prevent deterioration in visibility, achieve thinning of an edge part, and form the edge part having a dielectric constant of the same degree as that of a substrate formed of glass or the like while light shielding performance is maintained, and the presence of a scattering layer results in whiteness of the edge part (connection part). Therefore, the present invention contributes to provide a touch panel that can accomplish the four objectives described above.

In particular, when the scattering layer is formed from a multilayered structure in which a first dielectric layer and a second dielectric layer are alternately laminated and thicknesses of both the first dielectric layer and the second dielectric layer are equal to or less than 10 nm, a scattering effect in a visible light region required for a touch panel remarkably improves.

According to the method for manufacturing a touch panel with regard to the aspects of the prevent invention, it is possible to prevent deterioration in visibility, achieve thinning of an edge part, and form the edge part having a dielectric constant of the same degree as that of a substrate formed of glass or the like while light shielding performance is maintained, and a touch panel having a white edge part (connection part) can be stably produced.

According to the optical thin film with regard to the aspects of the present invention, deterioration in visibility is prevented, thinning of thickness is possible, and a scattering layer having a dielectric constant of the same degree as that of a substrate can be formed while light shielding performance is maintained, and the presence of the scattering layer results in whiteness.

EMBODIMENTS FOR CARRYING OUT THE INVENTION

A touch panel according to the first embodiment of the present invention will be described based on the drawings.

Figure 1:
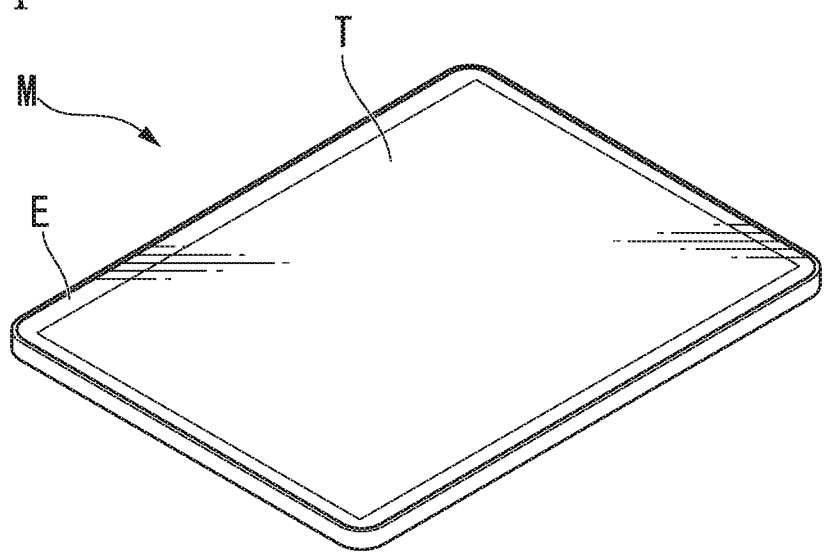
FIG. 1 is a perspective diagram showing a touch panel according to a first embodiment of the present invention.
Figure 2A:
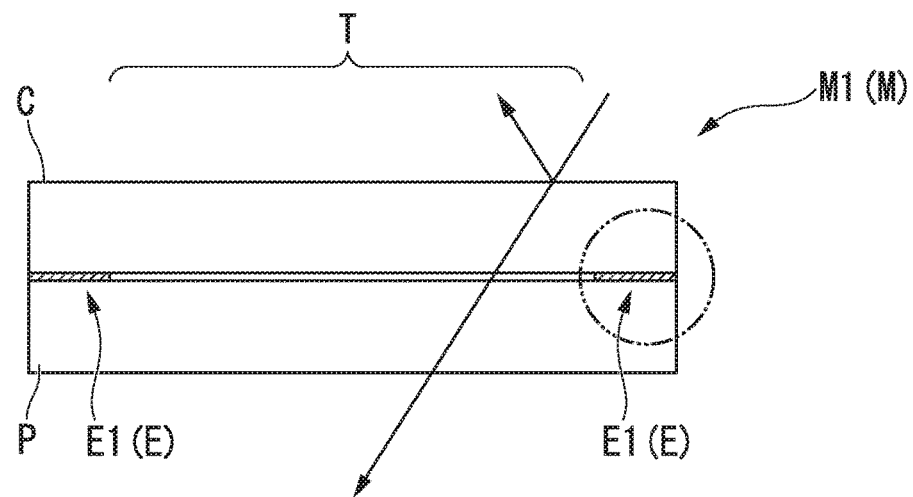
FIG. 2A is a cross-sectional diagram showing a configuration example of the touch panel according to the first embodiment of the present invention.
Figure 2B:
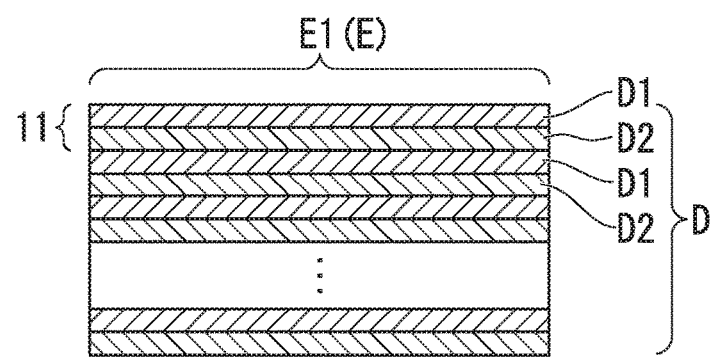
FIG. 2B is an enlarged cross-sectional diagram of a part showing a configuration example of the touch panel according to the first embodiment of the present invention.

FIG. 1 is a perspective diagram showing the touch panel according to the first embodiment of the present invention. FIG. 2A is a cross-sectional diagram showing a configuration example of the touch panel of FIG. 1. FIG. 2B is an enlarged cross-sectional diagram of a part (edge part) showing the configuration example of the touch panel of FIG. 1. In FIG. 1 and FIG. 2A, reference symbol M represents the touch panel.

The touch panel M of the present embodiment is formed by overlapping a touch panel substrate P that has a display area T and on which display and touch operations are possible and a cover substrate C that is formed of a transmissive substrate such as glass, as shown in FIG. 1 and FIG. 2A. A connection part is provided at an edge part E of the circumference of the display area T in the area between these substrates excluding the display area T (non-display area).

The touch panel substrate P is suitably used for mobile terminal apparatus such as mobile telephones, and there are three following representative structures.

(1) A structure in which a touch panel sensor unit and a liquid crystal display device are combined;

(2) A structure of a display device that includes a transparent touch switch and a liquid crystal display element in which a space between a display surface of the liquid crystal display element and a rear surface of an input area of the touch switch is filled with a transparent adhesive and thus the touch switch adheres to the liquid crystal display element; and (3) A structure of an image display device with a touch panel in which interfaces of a display panel and the touch panel are brought in close contact with each other interposing an adhesive layer therebetween, and thereby integrated.

Furthermore, the touch panel substrate P can also be employed in structures other than (1) to (3) described above and in various types such as projected capacitive type, resistive film type, and capacitive type structures.

The cover substrate C is a transparent substrate of, for example, glass, resin-laminated glass, or the like, and is overlapped the touch panel substrate P to form the outermost surface of the touch panel M.

The display area T has an area in a predetermined size and shape in a substrate in-plane direction that is orthogonal to a viewing direction. The display area T may be, for example, a rectangular area arranged in an in-plane center position of the touch panel substrate P.

The outer side of the display area T within the plane of the substrate is the edge part (frame part) E. As a connection part that connects the cover substrate C and the touch panel substrate P (brings them in contact) with each other and enables white to be recognized when the touch panel M is viewed, only a scattering layer D or both the scattering layer D and a reflection layer R are laminated in the edge part E from the cover substrate C side toward the touch panel substrate P side.

As the connection part, a structure in which only the scattering layer D is laminated on a surface of the cover substrate C facing the touch panel substrate P (FIG. 2B) is an exemplary example. In addition, a structure in which the scattering layer D is laminated and the reflection layer R is laminated on the scattering layer D (FIG. 4B) may also be employed. Although white can be obtained in the structure of FIG. 2B, if a density of the white is desired to be raised, the structure shown in FIG. 4B in which the reflection layer R is added to the scattering layer D is preferable. A position of the connection part is not limited to the edge part E, and the part can be formed in a desired area.

The scattering layer D is a film having a non-light-transmission property (light shielding property), and is an optical thin film formed of a multilayered film having different refractive indices to develop the white color. Specifically, the scattering layer D is a multilayered structure in which a number of high-refractive-index layers D1 formed of a material having a high refractive index and a number of low-refractive-index layers D2 formed of a material having a low refractive index are alternately laminated. That is, the scattering layer D is a multilayered structure in which a plurality of dielectric laminates 11 each formed of a first dielectric layer D1 and a second dielectric layer D2 are laminated.

The scattering layer D (dispersion layer) is a film that has excellent scattering power in an optical wavelength region, i.e., the visible light region in which the display area T of the touch panel M functions, and is an optical thin film formed of a multilayered film having different dielectric constants to emit the white color. Specifically, it is a multilayered structure in which a number of first dielectric layers D1 that are formed of a dielectric material having a higher dielectric constant and a number of second dielectric layers D2 that are formed of a dielectric material having a lower dielectric constant than the first dielectric layer D1 are alternately laminated.

A dielectric material to form the first dielectric layer D1 and the second dielectric layer D2 can be selected from, for example, $SiO_x$, $SiN$, $SiO_xN_y$, $Al_2O_3$, $AlN$, $MgO$, $MgF_2$, $HfO_2$, $Ta_2O_5$, $Nb_xO_y$, $TiO_2$, $Ti_3O_5$, $ZnO$, and $ZrO_2$.

In addition, two or three kinds of materials among these can also be selected to be combined.

Here, levels of dielectric constants are set by comparing dielectric constants of the selected materials. Thus, one kind of material may be a dielectric material having a high dielectric constant or a dielectric material having a low dielectric constant according to combinations of selected materials.

The first dielectric layer D1 and the second dielectric layer D2 preferably have a film thickness of 10 nm or less, and more preferably have a film thickness of 5 nm or less to exhibit scattering power to obtain white. Both layers need not have the same film thickness, and may have different film thicknesses. The number of times the first dielectric layer D1 and the second dielectric layer D2 are repeatedly laminated (the number of repetitions, or the number of laminations) is preferably 50 times or higher to obtain white. That is, in order to obtain white, it is preferable to form 50 or more dielectric laminates. By providing different film thicknesses of the first dielectric layer D1 and the film thickness of the second dielectric layer D2 without setting the thicknesses to be uniform for each laminate, the number of laminations can be reduced (or set to be low).

However, the scattering layer D according to the present embodiment is not limited to a multilayered film, and may be a single-layer film as long as it has a scattering function. As a single-layer film having a scattering function, a single-layer film that contains a scattering factor therein (for example, a granular structure, an uneven structure, a crystal structure, or a defect structure), a single-layer film whose internal composition is modulated in a thickness direction (for example, diffusion or doping of impurities), or the like is an exemplary example.

As the first dielectric layer D1 and the second dielectric layer D2 constituting the scattering layer D, a combination of silicon oxide and titanium oxide was selected. Samples having different combinations of surface reflectance and haze of the scattering layer D were produced by appropriately changing the film thicknesses and the number of laminations of the first dielectric layer D1 and the second dielectric layer D2. Table 1 shows evaluation results of degrees of whiteness of the scattering layer D whose surface reflectance was used in a range of 0 to 7.2 (%) and cloudiness (haze) was used in the range of 0 to 7.2 (%). In Table 1, symbol ○ indicates strong white, symbol Δ indicates pale white, and symbol x indicates transparency. "Multi-Spect 1500" manufactured by Shimazu Corporation was used for measuring the surface reflectance, and "HM 150" manufactured by Murakami Color Research Laboratory was used for measuring the cloudiness (haze).

TABLE 1

| Surface reflectance [%] | Cloudiness (Haze) [%] | | | | | | | |
|---|---|---|---|---|---|---|---|---|
| | 0 | 1.1 | 2.3 | 3.0 | 4.1 | 5.3 | 6.1 | 7.2 |
| 0 | x | x | x | x | x | x | x | x |
| 0.3 | x | x | x | x | x | x | x | x |
| 0.9 | x | x | x | x | x | x | x | x |
| 1.4 | x | x | x | x | x | x | x | x |
| 2.1 | x | x | x | x | x | x | x | x |
| 2.6 | x | x | x | x | x | x | x | x |
| 2.9 | x | x | x | x | x | x | x | x |
| 3.4 | x | x | x | x | x | x | x | x |
| 4.2 | x | x | x | x | Δ | Δ | Δ | Δ |
| 4.7 | x | x | x | x | Δ | Δ | Δ | Δ |
| 5.0 | x | x | x | x | Δ | Δ | Δ | Δ |
| 5.4 | x | x | x | x | Δ | Δ | Δ | ○ |
| 6.1 | x | x | x | x | Δ | Δ | Δ | ○ |
| 6.5 | x | x | x | x | Δ | Δ | ○ | ○ |
| 7.2 | x | x | x | x | Δ | ○ | ○ | ○ |

The following points are clarified based on Table 1.

(A1) The scattering layer D becomes transparent in the combinations of the surface reflectance of equal to or less than 3.4 and the haze of equal to or less than 3.0. The scattering layer D becomes transparent as well when the surface reflectance is equal to or less than 3.4 or the haze is equal to or less than 3.0.

(A2) The scattering layer D becomes a weak white in the combinations of the surface reflectance of equal to or more than 4.2 and the haze of equal to or more than 4.1.

(A3) Having the fields of the combinations of the surface reflectance and the haze that are (7.2, 5.3), (6.5, 6.1), and (5.4, 7.2) as a boundary, the scattering D becomes a strong white in the fields in which the surface reflectance and the haze have the aforementioned values or higher.

Therefore, if production conditions of the first dielectric layer D1 and the second dielectric layer D2 (film thickness, the number of laminations, etc.) are decided based on the tendency shown in (A1) to (A3) described above, the white scattering layer D according to the present embodiment is obtained.

The whiteness shown in Table 1 was evaluated based on the CIE 1976 (L*, a*, b*) color space. According to the display of the CIE 1976 (L*, a*, b*) color space, L* represents a brighter white as its value gets closer to 100. a* and b* represent whiteness if they respectively satisfy the conditions "−3<a*<3" and "−3<b*<3."

In the present invention, the case in which the scattering layer D is "weak white (symbol Δ)" indicates that L* is low, and the case in which the scattering layer D is "strong white (symbol ○)" indicates that L* is high.

Next, a case in which the reflection layer R overlaid on the scattering layer D is provided will be described.

Table 2 shows the evaluation results of whiteness in two cases in which only the scattering layer D is provided (the structure of FIG. 2B; Sample 1) and the reflection layer R is provided in addition to the scattering layer D to cover the scattering layer (the structure of FIG. 4B; Sample 2) based on the CIE 1976 (L*, a*, b*) color space.

TABLE 2

| | Scattering layer D | Reflection layer R | L* | a* | b* |
|---|---|---|---|---|---|
| Sample 1 | Present | Absent | 50 | 2 | 2 |
| Sample 2 | Present | Present | 70 | 2 | −2 |

Based on Table 2, it was clarified that all Samples 1 and 2 according to the present embodiment are white.

Particularly, it was found that the degree of whiteness further increases when the reflection layer R overlaid on the scattering layer D is provided (Sample 2) than when only the scattering layer D is provided (Sample 1).

As the reflection layer R, for example, a metal film formed of aluminum, gold, or the like and a dielectric multilayered film formed of an oxide, a fluoride, or the like are exemplary examples. However, since the touch panel of the present invention is used for applications to mobile terminals and the like, the reflection layer R provided to be overlaid on the scattering layer D of the present invention needs to satisfy a condition that it not hinder a communication function. Taking this condition into account, a dielectric multilayered film is more preferable than a metal film for the reflection layer R.

Therefore, the reflection layer R is a film having excellent reflection power in an optical wavelength region, i.e., the visible light region in which the display area T of the touch panel M functions, and is a film that does not block radio waves having a dielectric constant of the same level as that of a substrate formed of glass, and so on. In order to obtain a reflection layer R having a desired dielectric constant, this reflection layer R should be an optical thin film formed of a multilayered film having different dielectric constants. Specifically, the reflection layer R is a multilayered structure in which a number of first reflection layers R1 that are formed of a dielectric material having a high refractive index and a number of second reflection layers R2 that are formed of a dielectric material having a lower refractive index than that of the first reflection layers R1 are alternately laminated. That is, the reflection layer R is a multilayered structure in which a plurality of reflective laminates 12 each formed of the first reflection layer R1 and the second reflection layer R2 are laminated.

A dielectric material that forms the first reflection layer R1 and the second reflection layer R2 can be selected from, for example, $SiO_x$, SiN, $SiO_xN_y$, $Al_2O_3$, AlN, MgO, $MgF_2$, $HfO_2$, $Ta_2O_5$, $Nb_xO_y$, $TiO_2$, $Ti_3O_5$, ZnO, and $ZrO_2$.

In addition, two or three kinds of materials among these can also be selected to be combined.

Here, levels of refractive indices are set by comparing refractive indices of the selected materials. Thus, one kind of material may serve as a dielectric material having a high refractive index in some cases or as a dielectric material having a low refractive index in some cases according to combinations of selected materials.

For example, among the above-mentioned materials, a combination of titanium oxide as a dielectric material having a high refractive index (n=2.4) and silicon oxide as a dielectric material having a low refractive index (n=1.46) can be selected.

As each film thickness of the first reflection layer R1 and the second reflection layer R2, about 100 nm to 200 nm is preferable to exhibit reflection power in the visible light region. The first reflection layer R1 and the second reflection layer R2 need not have the same film thickness and may have different ones. The number of times the first reflection layer R1 and the second reflection layer R2 are repeatedly laminated (the number of repetitions, or the number of laminations) is preferably 3 to 10 times or higher to obtain the reflecting power. That is, in order to obtain the reflecting power, it is preferable to form 3 to 10 or more reflective laminates. By providing different film thicknesses of the first reflection layer R1 and the second reflection layer R2 without setting the thicknesses to be uniform for each laminate, the number of laminations can be reduced (or set to be low).

In addition, a total film thickness of the laminated first reflection layers R1 and second reflection layers R2 (i.e., a film thickness of the reflection layer R) is set so that visible light can be reflected and radio waves are not blocked.

By forming the connection part in which the reflection layer R is laminated to overlap the scattering layer D as described above, a light beam that would be transmitted through the scattering layer D returns into the scattering layer D again due to the presence of the reflection layer R, and thus scattering power of the scattering layer D can be further improved. Furthermore, the connection part described above can be formed through sputtering, without using a wet process such as a print process (print process).

Next, a method for manufacturing the touch panel according to the present embodiment will be described.

Figure 3:
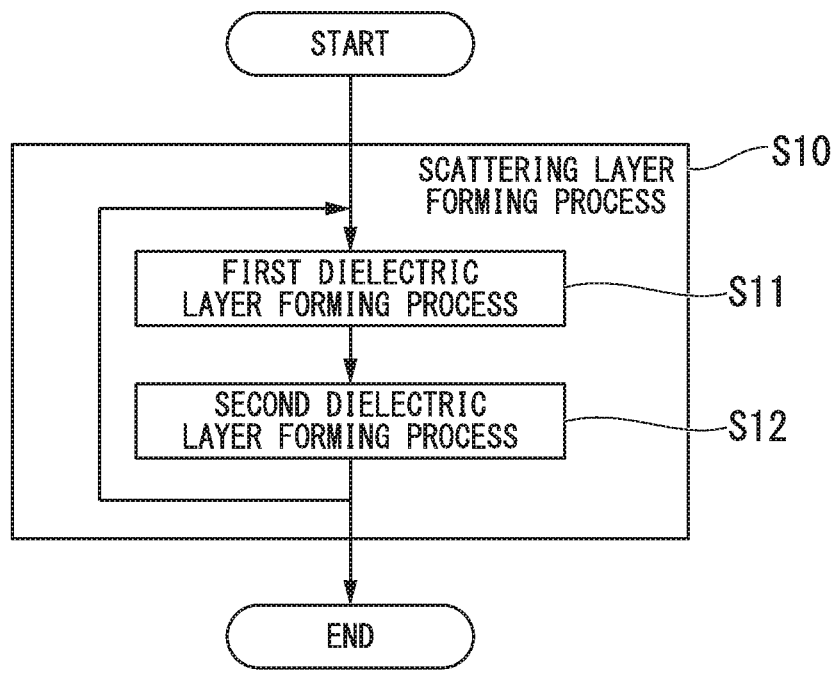
FIG. 3 is a process diagram showing an example of a method for manufacturing the touch panel according to the first embodiment of the present invention.

FIG. 3 is a flowchart showing an example of the method for manufacturing the touch panel according to the present embodiment, showing a case in which only the scattering layer D is provided (the case of the configuration of FIG. 2B).

In the method for manufacturing the touch panel according to the present embodiment, the cover substrate C formed of glass is prepared, and the scattering layer D is formed on the cover substrate C of which the display area T has a mask as a scattering layer forming process S10 as shown in FIG. 3. Then, the mask is removed, and the cover substrate C on which the scattering layer D is formed and a touch panel substrate are bonded together.

In the scattering layer forming process S10, the first dielectric layers D1 and the second dielectric layers D2 are laminated to have a predetermined film thickness using a material that is appropriately selected for the scattering layer D. At this time, the scattering layer D is formed through sputtering by repeating a first dielectric layer forming process S11 and a second dielectric layer forming process S12 a number of times.

Figure 4A:
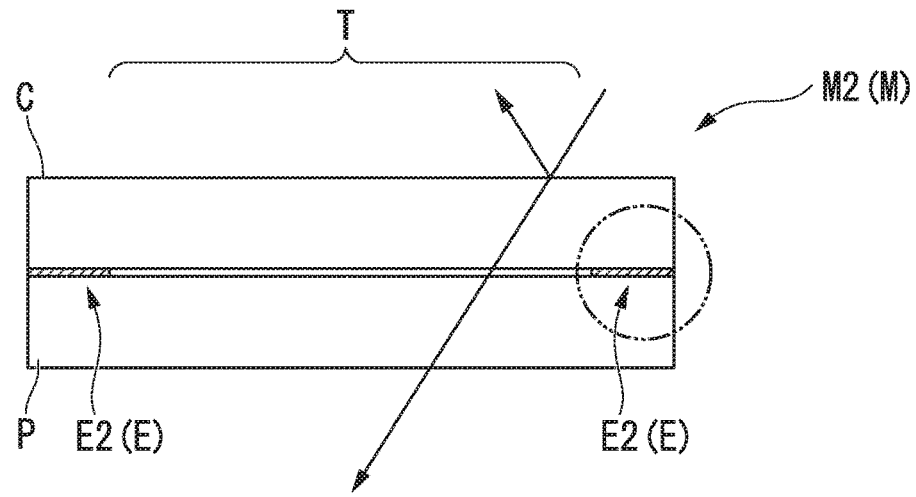
FIG. 4A is a cross-sectional diagram showing another configuration example of the touch panel according to the first embodiment of the present invention.
Figure 4B:
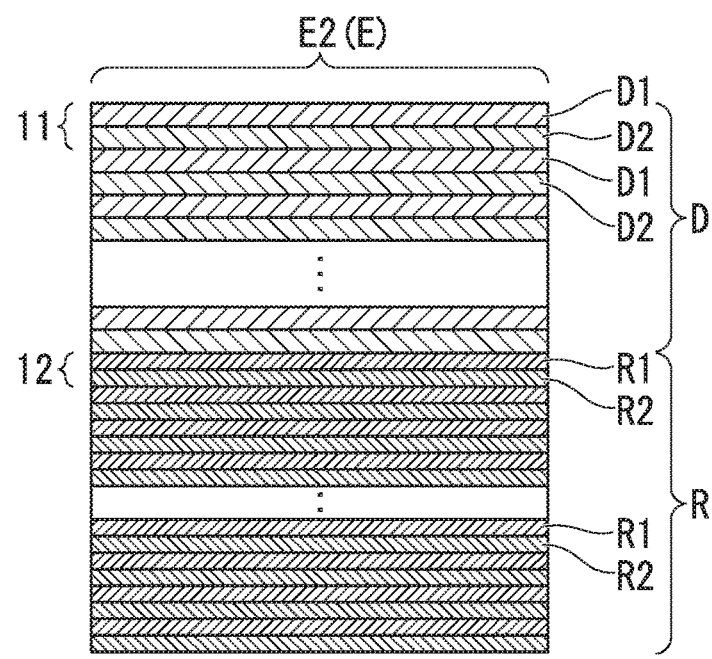
FIG. 4B is an enlarged cross-sectional diagram of a part showing the other configuration example of the touch panel according to the first embodiment of the present invention.
Figure 5:
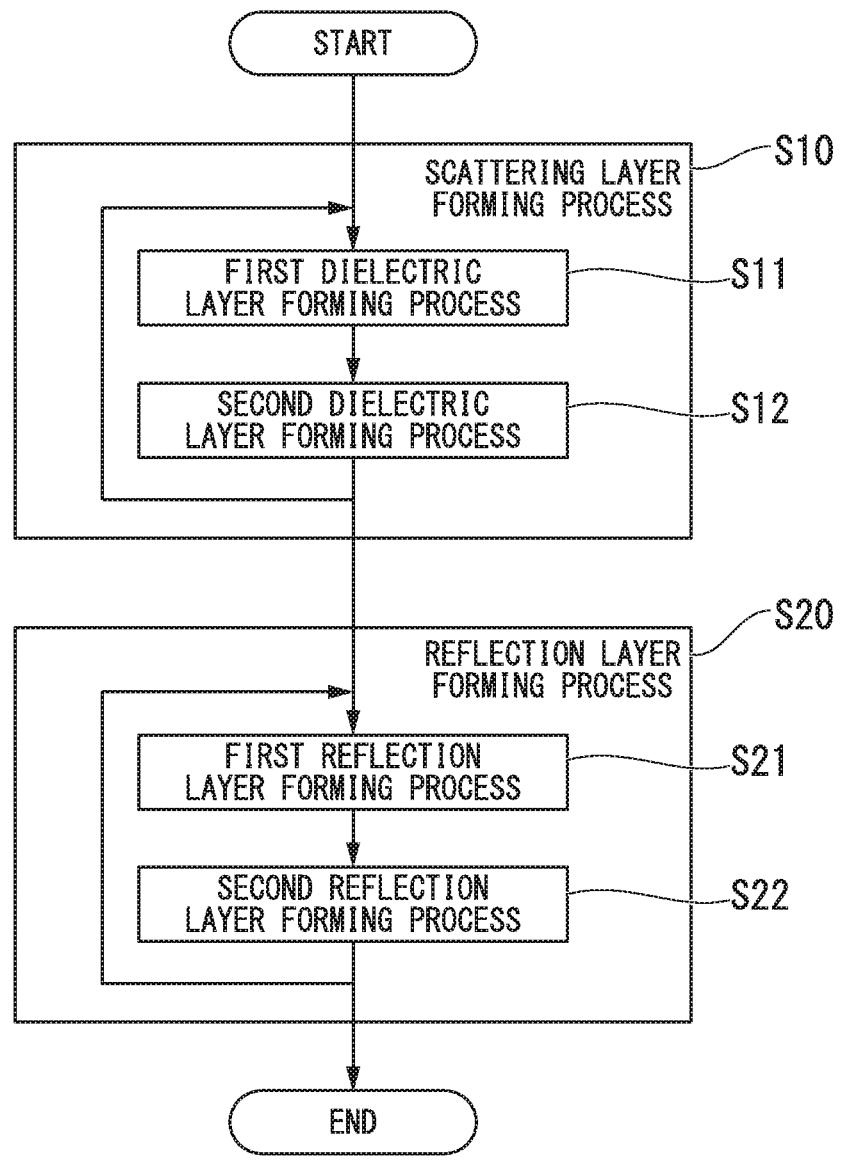
FIG. 5 is a process diagram showing a method for manufacturing the other configuration example of the touch panel according to the first embodiment of the present invention.

FIG. 5 is a flowchart showing an example of a method for manufacturing the touch panel according to the present embodiment, showing the case in which the reflection layer R overlaid on the scattering layer D is provided (the case of the configuration of FIG. 4B).

In the method for manufacturing the touch panel according to the present embodiment, the cover substrate C formed of glass is prepared, and the scattering layer D is formed on the cover substrate C of which the display area T has a mask as the scattering layer forming process S10 as shown in FIG. 3. Then, the reflection layer R is formed as a reflection layer forming process S20. Then, the mask is removed, and the cover substrate C on which the reflection layer R is formed to be overlaid on the scattering layer D and a touch panel substrate are bonded together.

In the scattering layer forming process S10, the first dielectric layers D1 and the second dielectric layers D2 are laminated to have a predetermined film thickness using a material that is appropriately selected for the scattering layer D. At this time, the scattering layer D is formed through sputtering by repeating the first dielectric layer forming process S11 and the second dielectric layer forming process S12 a number of times.

In the reflection layer forming process S20, the first reflection layers R1 and the second reflection layers R2 are laminated to have a predetermined film thickness using a material that is appropriately selected for the reflection layer R. At this time, the reflection layer R is formed through sputtering by repeating a first reflection layer forming process S21 and a second reflection layer forming process S22 a number of times.

In this case, the film formation can be performed using a deposition apparatus, a parallel-plate magnetron sputtering apparatus, or the like that can form a film by alternately laminating two or three kinds of materials. A carousel-type sputtering apparatus is shown in FIG. 6 as an example of the apparatus relating to the present embodiment.

Figure 6:
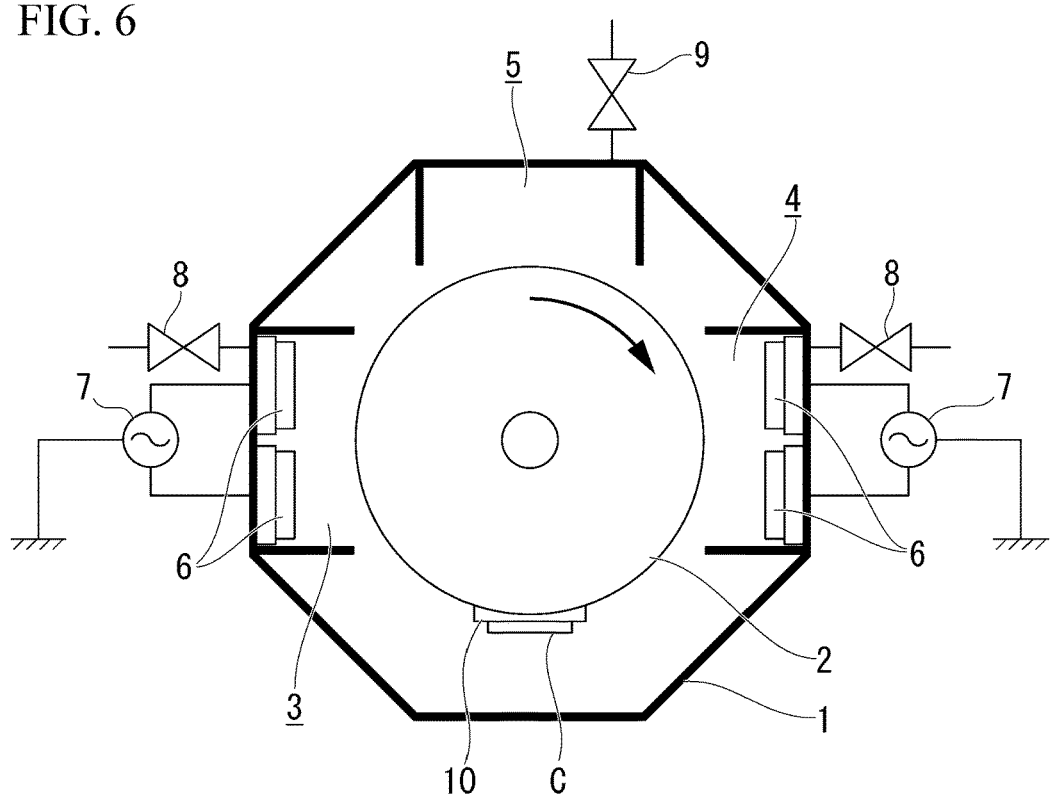
FIG. 6 is a schematic diagram showing a manufacturing apparatus used in manufacturing the touch panel according to the first embodiment of the present invention.
Figure 7:
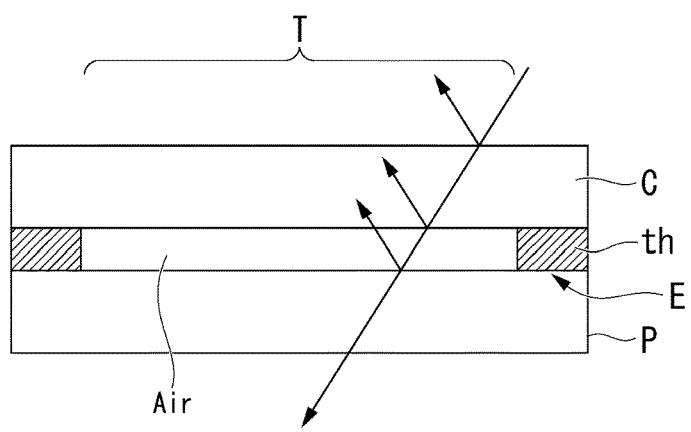
FIG. 7 is a cross-sectional diagram showing a configuration example of a touch panel of the related art.

FIG. 6 is a schematic diagram showing a manufacturing apparatus to be used in manufacturing the touch panel according to the present embodiment.

The manufacturing apparatus according to the present embodiment is a carousel-type sputtering apparatus, and as shown in FIG. 6, a chamber contains a drum 2 that rotates with a substrate holder 10 attached thereto, and a CA1 chimney 3 and a CA2 chimney 4 that face the outer circumference of the drum 2 and can sputter different materials, and an oxidation source supply unit 5 that is connected with a gas feeding port 9 that can supply an oxidation source such as oxygen gas when reactive sputtering is performed are provided.

The CA1 chimney 3 and the CA2 chimney 4 are installed at circumferential positions corresponding to the substrate holder 10 of the drum 2 that rotates as shown in FIG. 6, and are provided with AC cathodes 6 that are connected to AC power sources 7 and gas feeding ports 8 that supply an atmospheric gas such as Ar into the chimneys.

The cover substrate C on which a mask is formed in a surface portion corresponding to the display area T or the cover substrate C on which the scattering layer D is further formed is mounted on the substrate holder 10.

In the scattering layer forming process S10, silicon that is a silicon oxide source as an example of a base material of the first dielectric layer D1 and titanium that is a titanium oxide source as an example of a base material of the second dielectric layer D2 are set in the cathodes 6 of the CA1 chimney 3 and the CA2 chimney 4, respectively. Then, the cover substrate C on which the mask is formed is fixed to the substrate holder 10 of the drum 2, an atmospheric gas such as argon is supplied from the gas feeding port 8, at the same time, an oxidation source such as oxygen gas is supplied to the oxidation source supply unit 5 via the gas feeding port 9, and then the drum 2 rotates. By supplying electric power from the AC power sources 7 to the cathodes 6 in this oxidative atmosphere state, a film can be formed of silicon oxide in the CA1 chimney 3 and a film can be formed of titanium oxide in the CA2 chimney 4 through reactive sputtering.

Each of the first dielectric layer D1 and the second dielectric layer D2 constituting the scattering layer D needs to be formed to an ultrathin thickness of 10 nm or less. Thus, when the first dielectric layer D1 or the second dielectric layer D2 are formed, for example, a combined condition that the number of rotations of the drum 2 be increased and sputtering power be lowered, or the like is used.

In the scattering layer forming process S10, the first dielectric layers D1 and the second dielectric layers D2 are laminated to have a predetermined film thickness using a material appropriately selected for the scattering layer D as shown in FIG. 2B and FIG. 4B. At this time, the first dielectric layer D1 and the second dielectric layer D2 are alternately laminated by repeating the first dielectric layer forming process S11 and the second dielectric layer forming process S12 a number of times.

In this case, the first dielectric layer forming process S11 and the second dielectric layer forming process S12 can be repeated a necessary number of times by controlling supply of electric power to the cathodes 6 of the CA1 chimney 3 and the CA2 chimney 4 to be alternately switched.

In the reflection layer forming process S20, the first reflection layers R1 and the second reflection layers R2 are laminated to have a predetermined film thickness using a material appropriately selected for the reflection layer R as shown in FIG. 4B. At this time, the reflection layer R is formed as a multilayered structure through sputtering by repeating the first reflection layer forming process S21 and the second reflection layer forming process S22 a number of times.

In the reflection layer forming process S20, silicon that is a silicon oxide source as an example of a base material of the first reflection layers R1 and titanium that is a titanium oxide source as an example of a base material of the second reflection layers R2 are set for the cathodes 6 of the CA1 chimney 3 and the CA2 chimney 4, respectively. Then, the cover substrate C on which the mask is formed is fixed to the substrate holder 10 of the drum 2, an atmospheric gas such as argon is supplied from the gas feeding port 8, an oxidation source such as oxygen gas is supplied to the oxidation source supply unit 5 via the gas feeding port 9 at the same time, and then the drum 2 rotates. By supplying electric power from the AC power sources 7 to the cathodes 6 in this oxidative atmosphere state, a film can be formed of silicon oxide in the CA1 chimney 3 and a film can be formed of titanium oxide in the CA2 chimney 4 through reactive sputtering.

While the first dielectric layer D1 or the second dielectric layer D2 constituting the scattering layer D is ultrathin having a thickness of 10 nm or thinner, the first reflection layers R1 or the second reflection layers R2 constituting the reflection layer R has a thickness of 100 nm or thicker, which is 10 times that of the dielectric layers or more. For example, when the first reflection layer R1 having a thickness of 100 nm is formed, discharge (plasma) for forming the second reflection layer R2 is stopped, the drum is rotated a plurality of times, and thereby the first reflection layer R2 formed with a film thickness of 100 nm or thicker is formed. Next, when the second reflection layer R2 having a thickness of 100 nm is formed, discharge (plasma) for forming the first reflection layer R1 is stopped, the drum 2 is rotated a plurality of times, and thereby the second reflection layer R2 formed with a film thickness of 100 nm or thicker is formed. By repeating this operation, the reflection layer R in the multilayered structure as shown in FIG. 4B is formed.

As described above, a multilayered film can be laminated in one chamber using targets of the same combination by changing only a film formation condition in the scattering layer forming process S10 and the reflection layer forming process S20.

That is, since the scattering layer forming process S10 and the reflection layer forming process S20 can be consecutively performed according to the present embodiment, a manufacturing process excellent in mass productivity can be performed.

According to the present embodiment, by providing the connection part constituted by the scattering layer P and the reflection layer R laminated from the cover substrate C side toward the touch panel substrate T side as described above, while emission of white is realized, the edge part E can have a visible light shielding property, maintain a dielectric constant of the same degree as that of glass, and allow radio waves to pass therethrough. Furthermore, since the thickness of the connection part can be set to be thinner than 2 μm, a space is not generated between the cover substrate C and the touch panel substrate P, and thereby the touch panel M that prevents diffuse reflection and has improved visibility can be realized.

EXAMPLE

An embodiment of the present invention will be described below.

Using the carousel-type sputtering apparatus shown in FIG. 6 that had silicon and titanium as targets 6, electric power was simultaneously supplied to respective silicon and titanium sides to put both the silicon side and titanium side into a state in which sputtering film formation was possible, and then the drum 2 was rotated at 200 rpm. In this case, a scattering layer D was formed with supply of oxygen gas as an oxidation source.

Successively, using the carousel-type sputtering apparatus shown in FIG. 6 that had silicon and titanium as targets 6, the drum 2 was rotated at 200 rpm in the carousel-type sputtering apparatus that had silicon and titanium as targets 6, electric power was supplied to the silicon side while the drum 2 was rotated three times, then discharge was stopped, and electric power was supplied to the titanium side. At this time, a reflection layer R was formed with supply of oxygen gas as an oxidation source.

Specifically, through the above-described procedure, a film structure in which the reflection layer R, which was obtained by repeatedly laminating a first reflection layer R1 (100 nm) formed of silicon oxide and a second reflection layer R2 (150 nm) formed of titanium oxide five times, was provided on the scattering layer D, which was obtained by repeatedly laminating a first dielectric layer D1 (3 nm) formed of silicon oxide and a second dielectric layer D2 (5 nm) formed of titanium oxide 50 times, was obtained.

Thereby, white could be emitted due to the presence of the scattering layer D. By providing the reflection layer R overlaid on the scattering layer D, the white color could increase in intensity. In addition, according to the above-described configuration, dielectric constants of the scattering layer D and the reflection layer R could be set to have the same dielectric constant as glass, and visible light could be shielded by setting its visible light transmittance to be 1% or lower.

Furthermore, according to the present invention, it was possible to form the connection part to have a thickness thinner than one formed by a print process (about 5 μm).

INDUSTRIAL APPLICABILITY

As application examples of the present invention, the invention can be favorably used for touch panels incorporated into mobile telephones, smartphones, tablets, notebook PCs with a touch function, vending machines with a touch function, and the like. In addition, the invention can be applied to optical thin films installed on window glass of houses and buildings, window glass of automobiles, trains, aircraft, and ships, front glass of signboards and illuminations, and the like.

DESCRIPTION OF THE REFERENCE SYMBOLS

M: touch panel
C: cover substrate
D: scattering layer (connection part)
D1: first dielectric layer
D2: second dielectric layer
E: edge part
P: touch panel substrate
R: reflection layer (connection part)
R1: first reflection layer
R2: second reflection layer
T: display area
11: dielectric laminate

What is claimed is:

1. A touch panel comprising:
a touch panel substrate;
a cover substrate provided to overlap the touch panel substrate; and
a white connection part including a white scattering layer laminated from the cover substrate side toward the touch panel substrate side and being provided between the touch panel substrate and the cover substrate in an area other than a display area, wherein
the white scattering layer is formed from a multilayered structure in which a first dielectric layer and a second dielectric layer are alternately laminated,
a film thickness of each of the first dielectric layer and the second dielectric layer is equal to or less than 10 nm, and
in the multilayered structure of the white scattering layer, the number of dielectric laminates formed of the first dielectric layer and the second dielectric layer is equal to or more than 50, and wherein
the white connection part includes the white scattering layer and a reflection layer formed to cover the white scattering layer,
the reflection layer is formed as a multilayered structure constituted of a first reflection layer and a second reflection layer,
the multilayered structure of the reflection layer is made of the same material as that of the multilayered structure of the white scattering layer,
a thickness of the first reflection layer is 10 times or more that of the first dielectric layer, and
a thickness of the second reflection layer is 10 times or more that of the second dielectric layer.

2. An optical thin film comprising:
a white scattering layer formed from a multilayered structure in which a first dielectric layer and a second dielectric layer are alternately laminated;
a film thickness of each of the first dielectric layer and the second dielectric layer is equal to or less than 10 nm; and
a reflection layer provided to cover the white scattering layer, wherein
in the multilayered structure of the white scattering layer, the number of dielectric laminates formed of the first dielectric layer and the second dielectric layer is equal to or more than 50, and wherein
the reflection layer is formed as a multilayered structure constituted of a first reflection layer and a second reflection layer,
the multilayered structure of the reflection layer is made of the same material as that of the multilayered structure of the white scattering layer,
a thickness of the first reflection layer is 10 times or more that of the first dielectric layer, and
a thickness of the second reflection layer is 10 times or more that of the second dielectric layer.

3. The optical thin film according to claim 2, wherein the optical thin film is formed on a transparent substrate.

4. The optical thin film according to claim 3, wherein the transparent substrate is formed of glass or a resin.

* * * * *